United States Patent
Chung et al.

(10) Patent No.: US 10,304,716 B1
(45) Date of Patent: May 28, 2019

(54) PACKAGE STRUCTURE AND MANUFACTURING METHOD THEREOF

(71) Applicant: Powertech Technology Inc., Hsinchu County (TW)

(72) Inventors: Hsing-Te Chung, Hsinchu County (TW); Yong-Cheng Chuang, Hsinchu County (TW); Kuo-Ting Lin, Hsinchu County (TW); Nan-Chun Lin, Hsinchu County (TW)

(73) Assignee: Powertech Technology Inc., Hsinchu County (TW)

( * ) Notice: Subject to any disclaimer, the term of this patent is extended or adjusted under 35 U.S.C. 154(b) by 0 days.

(21) Appl. No.: 15/847,936

(22) Filed: Dec. 20, 2017

(51) Int. Cl.
*H01L 21/683* (2006.01)
*H01L 23/498* (2006.01)
(Continued)

(52) U.S. Cl.
CPC ........ *H01L 21/6835* (2013.01); *H01L 21/561* (2013.01); *H01L 23/49816* (2013.01); *H01L 23/49827* (2013.01); *H01L 25/18* (2013.01); *H01L 25/50* (2013.01); *H01L 24/16* (2013.01); *H01L 24/48* (2013.01); *H01L 2221/68309* (2013.01); *H01L 2221/68368* (2013.01); *H01L 2224/16227* (2013.01); *H01L 2224/48227* (2013.01); *H01L 2924/19105* (2013.01); *H01L 2924/19106* (2013.01)

(58) Field of Classification Search
CPC ... H01L 21/6835; H01L 25/50; H01L 21/561; H01L 21/18; H01L 23/49816; H01L 23/49827; H01L 24/16; H01L 24/48
See application file for complete search history.

(56) References Cited

U.S. PATENT DOCUMENTS 5,859,475 A * 1/1999 Freyman ............. H01L 23/3128
257/688
9,502,272 B2 * 11/2016 Chen .................. H01L 23/3128
(Continued)

FOREIGN PATENT DOCUMENTS

| CN | 101009230 | 8/2007 |
|----|-----------|--------|
| TW | 201423851 | 6/2014 |

(Continued)

*Primary Examiner* — William Coleman
(74) *Attorney, Agent, or Firm* — JCIPRNET

(57) ABSTRACT

A manufacturing method of a package structure is provided. The method includes the following steps. A package panel is provided. The package panel includes a first encapsulation, a plurality of first integrated circuit components and a plurality of redistribution circuit patterns electrically connected to the first integrated circuit components, the first integrated circuit components are encapsulated by the first encapsulation, and the redistribution circuit patterns are distributed on the first encapsulation and the first integrated circuit components. The first encapsulation of the package panel is cut to form a plurality of singulated package strips. One of the singulated package strips is attached onto an attachment region of a substrate. The substrate includes at least one tooling hole distributed outside of the attachment region. The package process is performed over the singulated package strip with the substrate affixed through the tooling hole to form the package structure.

19 Claims, 7 Drawing Sheets

(51) Int. Cl.
*H01L 25/18* (2006.01)
*H01L 21/56* (2006.01)
*H01L 25/00* (2006.01)
*H01L 23/00* (2006.01)

(56) References Cited

U.S. PATENT DOCUMENTS

| | | | |
|---|---|---|---|
| 9,831,170 B2 * | 11/2017 | Scanlan | ............ H01L 23/49838 |
| 2013/0119539 A1 | 5/2013 | Hsiao et al. | |
| 2015/0014864 A1 | 1/2015 | Chen et al. | |
| 2017/0152593 A1 * | 6/2017 | Ries | ........................ C23C 14/52 |

FOREIGN PATENT DOCUMENTS

| | | |
|---|---|---|
| TW | I467668 | 1/2015 |
| TW | I480992 | 4/2015 |

* cited by examiner

PACKAGE STRUCTURE AND MANUFACTURING METHOD THEREOF

BACKGROUND OF THE INVENTION

Field of Invention

The present invention relates to a manufacturing method, and more particularly, to a manufacturing method of package structure.

Description of Related Art

Generally, wafer level or panel level package is to be understood as meaning that the entire packaging and all the interconnections on the wafer as well as other processing steps such as wire bonding, die bonding or molding, are carried out before the singulation by dicing into a plurality of semiconductor dies. However, it requires large-scale equipment to perform such processes in wafer or panel level format. Further, it requires very heavy capital investment for such large-scale equipment, while such capital investment does not provide cost benefits. Therefore, how to accomplish the processing steps using existing equipment to minimize equipment costs and overall manufacturing costs has become a challenge to researchers in the field.

SUMMARY OF THE INVENTION

The invention provides a manufacturing method of a package structure, which increases the production and provides processing stability.

The invention provides a manufacturing method of a package structure. The method includes the following steps. A package panel is provided. The package panel includes a first encapsulation, a plurality of first integrated circuit components and a plurality of redistribution circuit patterns electrically connected to the first integrated circuit components, the first integrated circuit components are encapsulated by the first encapsulation, and the redistribution circuit patterns are distributed on the first encapsulation and the first integrated circuit components. The first encapsulation of the package panel is cut to form a plurality of singulated package strips. Each of the singulated package strips includes a first singulated encapsulation, one of the redistribution circuit patterns and at least one of the first integrated circuit components encapsulated by the first singulated encapsulation. One of the singulated package strips is attached onto an attachment region of a substrate. The substrate includes at least one tooling hole distributed outside of the attachment region. A package process is performed over the singulated package strip attached onto the substrate with the substrate affixed through the at least one tooling hole to form the package structure.

The invention provides a manufacturing method of a package structure. The method includes the following steps. A package panel is provided in a first process chamber. The package panel includes a first encapsulation, a plurality of first integrated circuit components and a plurality of redistribution circuit patterns electrically connected to the first integrated circuit components, the first integrated circuit components are encapsulated by the first encapsulation, and the redistribution circuit patterns are distributed on the first encapsulation and the first integrated circuit components. The first encapsulation of the package panel is cut to form a plurality of singulated package strips in the first process chamber. Each of the singulated package strips includes a first singulated encapsulation, one of the redistribution circuit patterns and at least one of the first integrated circuit components encapsulated by the first singulated encapsulation. The singulated package strips are transferred to a second process chamber. At least one holding fixture is configured in the second process chamber. One of the singulated package strips is attached onto an attachment region of a substrate in the second process chamber. The substrate includes at least one tooling hole distributed outside of the attachment region. The substrate is affixed by the at least one holding fixture in the second process chamber. The at least one holding fixture corresponds to the at least one tooling hole of the substrate. A package process is performed over the singulated package strip attached onto the substrate to form the package structure in the second process chamber.

Based on the above, the package panel is cut to form the singulated package strips before the package process so as to avoid using large-scale equipment to perform such package process. As such, existing equipment may be leveraged with changes and compatible to the manufacturing process flow and also it maintains a stable manufacturing process which can be cost optimized according to the applications being implemented in the package.

To make the above features and advantages of the present invention more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
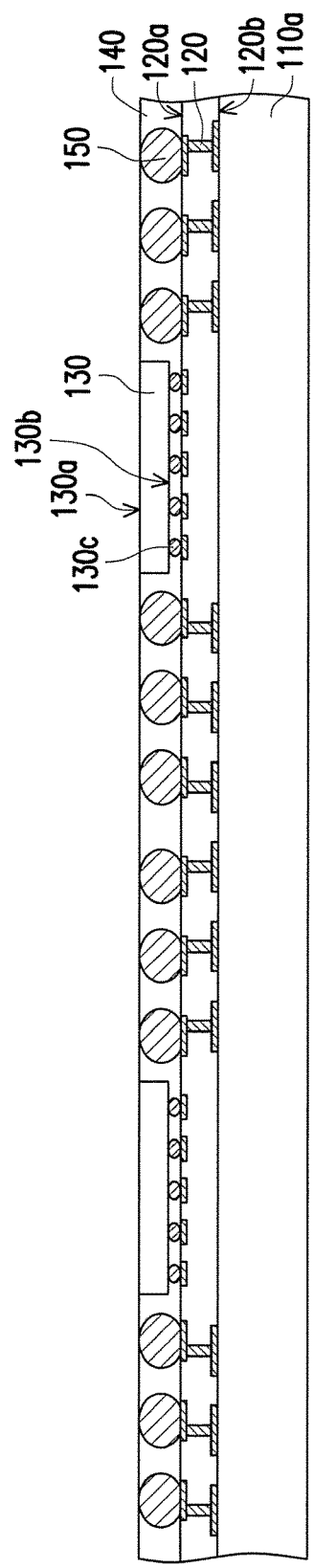
FIG. 1 is a schematic cross-sectional view illustrating a manufacturing method of a package structure according to an embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1 is a schematic cross-sectional view illustrating a manufacturing method of a package structure according to an embodiment of the invention. Referring to FIG. 1, FIG. 1 shows a portion of a package at an intermediate stage of manufacturing process. A plurality of redistribution circuit patterns 120 is formed over a carrier 110a. The carrier 110a is, for example, a glass substrate or other suitable substrate material, which is not limited thereto as long as the material is able to withstand the subsequent processes while carrying the package formed thereon. The redistribution circuit patterns 120 include a first surface 120a and a second surface 120b opposite to the first surface 120a. The second surface 120b faces towards and is adhered to the carrier 110a. A plurality of conductive terminals 150 are formed over the first surface 120a of the redistribution circuit patterns 120 by a placement process and/or a reflow process so as to electrically connect to the redistribution circuit patterns 120. For example, the conductive terminals 150 may be conductive bumps, conductive pillars or other possible forms and shapes, which is not limited thereto.

In the present embodiment, a plurality of first integrated circuit components 130 are formed over the first surface 120a of the redistribution circuit patterns 120 with the conductive terminals 150 surrounding the first integrated circuit components 130. Moreover, the first integrated circuit component 130 has a rear surface 130a and an active surface 130b opposite to the rear surface 130a. The active surface 130b of the first integrated circuit components 130 are electrically connected to the redistribution circuit patterns 120 by bumps 130c. For instance, the first integrated circuit components 130 may be an ASIC (Application-Specific Integrated Circuit) or other suitable active devices, which is not limited thereto. In some embodiments, the chip bonding process of the first integrated circuit components 130 is performed prior to the formation of the conductive terminals 150. In some alternative embodiments, the chip bonding process of the first integrated circuit components 130 is performed after the formation of the conductive terminals 150. In addition, a first encapsulation 140 is formed over the first surface 120a of the redistribution circuit patterns 120 to encapsulate the first integrated circuit components 130 and the conductive terminals 150. For example, the first encapsulation 140 may be a molding compound formed by molding processes. However, in some embodiments, the first encapsulation 140 may be formed by an insulating material such as epoxy or other suitable insulating resins, which is not limited thereto.

Figure 3A:
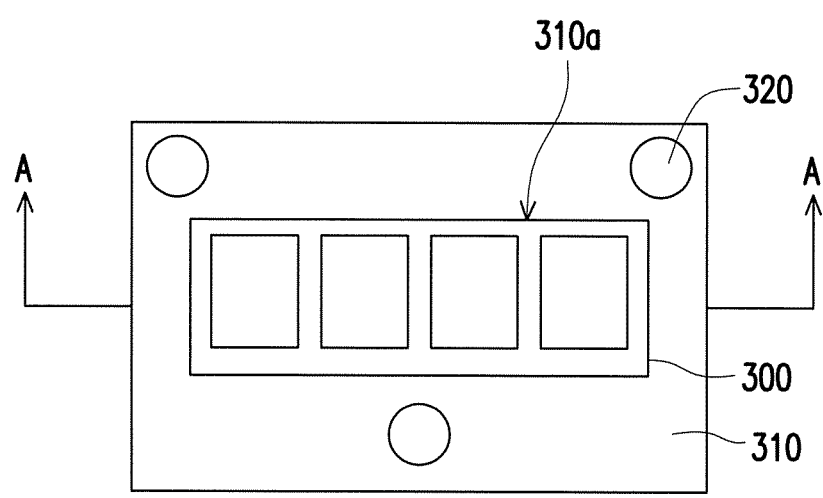
FIG. 3A is schematic top view illustrating a manufacturing method of a package structure according to an embodiment of the invention.
Figure 3B:
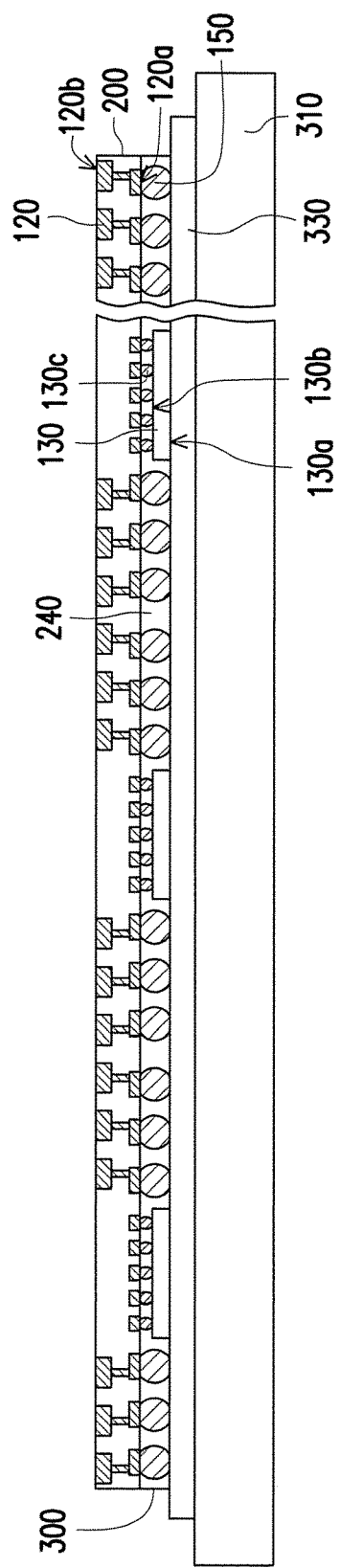
FIG. 3B is a schematic cross-sectional view along the line A-A of the manufacturing method of the package structure in FIG. 3A.
Figure 3C:
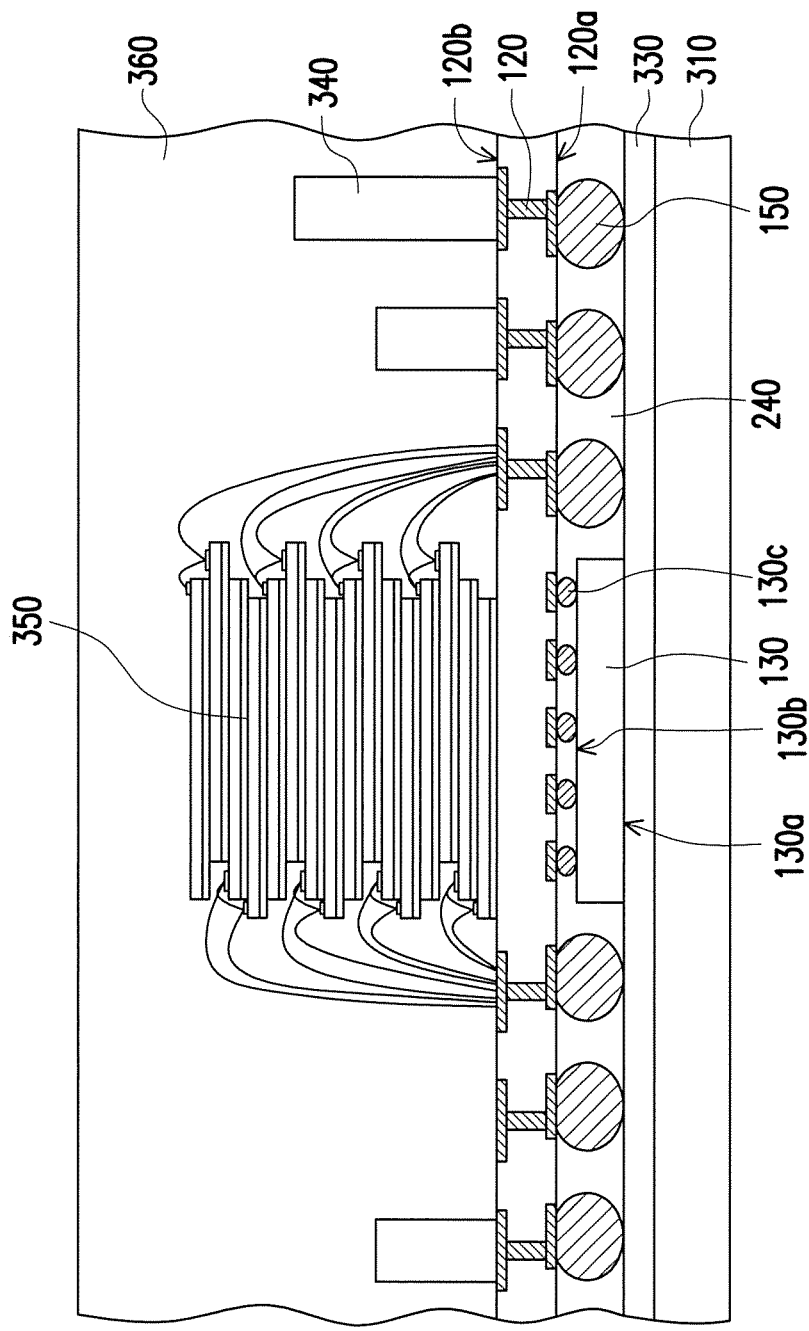
FIG. 3C to FIG. 3D are schematic cross-sectional views illustrating a manufacturing method of a package structure according to an embodiment of the invention.
Figure 3D:
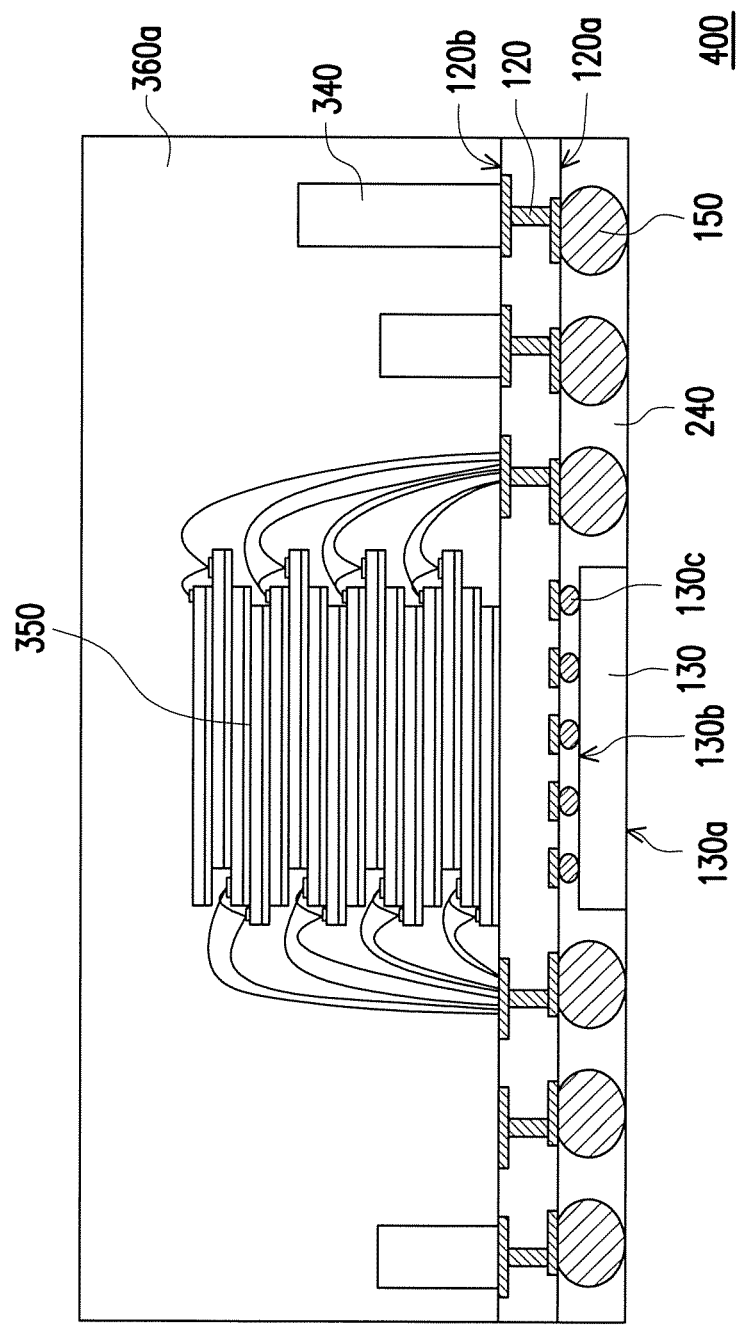

Furthermore, the first encapsulation 140 may be grinded by a chemical mechanical polishing (CMP) or other suitable grinding technique in order to expose the conductive terminals 150 and reduce the overall thickness of the package structure 400 (shown in FIG. 3D). In one embodiment, after the grinding process, the rear surface 130a of the first integrated circuit components 130 and the conductive terminals 150 may be exposed simultaneously. Moreover, the exposed rear surface 130a of the integrated circuit components 130 and the exposed surface of the conductive terminals 150 may be aligned after grinding. In another embodiment, after the grinding process, the conductive terminals 150 may be exposed while the rear surface 130a of the first integrated circuit components 130 may be covered by the first encapsulation 140. Moreover, the thickness of the first integrated circuit components 130 may be, for instance, less than the diameter (or thickness) of the grinded conductive terminals 150. In some embodiment, the grinding process may be omitted depending on the design requirement. Next, the second surface 120b of the redistribution circuit patterns 120 is de-bonded from the carrier 110a by physical treatment (e.g. laser lift-off process) or chemical treatment (e.g. chemical etching). In one embodiment, the de-bonding layer (not shown) may be disposed between the second surface 120b of the redistribution circuit patterns 120 and the carrier 100a. In other words, the de-bonding layer (not shown) may be formed on the carrier 100a prior to the formation of the redistribution circuit patterns 120. As such, the de-bonding between the redistribution circuit patterns 120 and the carrier 110a may be performed by peeling off the de-bonding layer from the redistribution circuit patterns 120 or the carrier 100a.

Figure 2A:
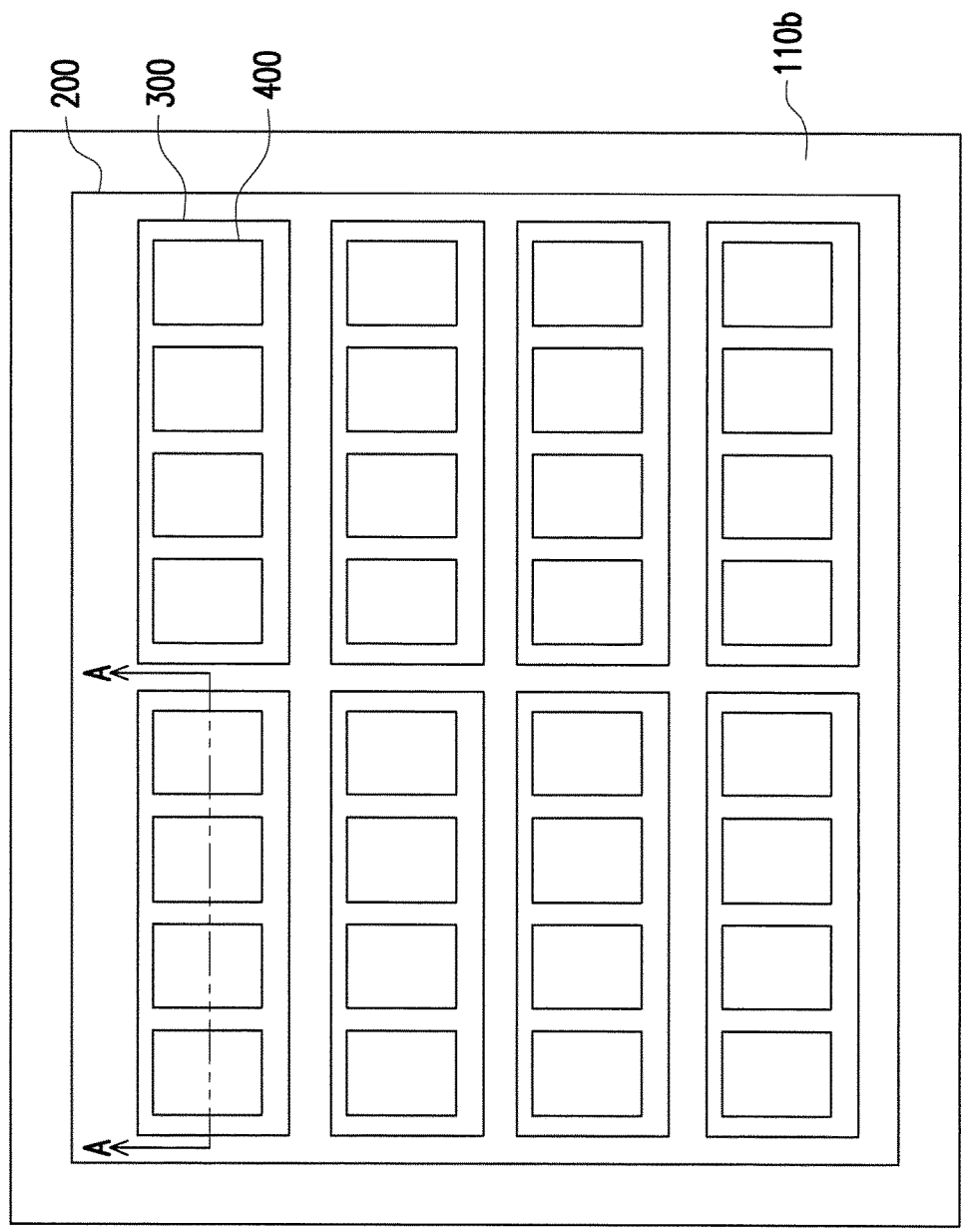
FIG. 2A is a schematic top view illustrating a manufacturing method of a package structure according to an embodiment of the invention.
Figure 2B:
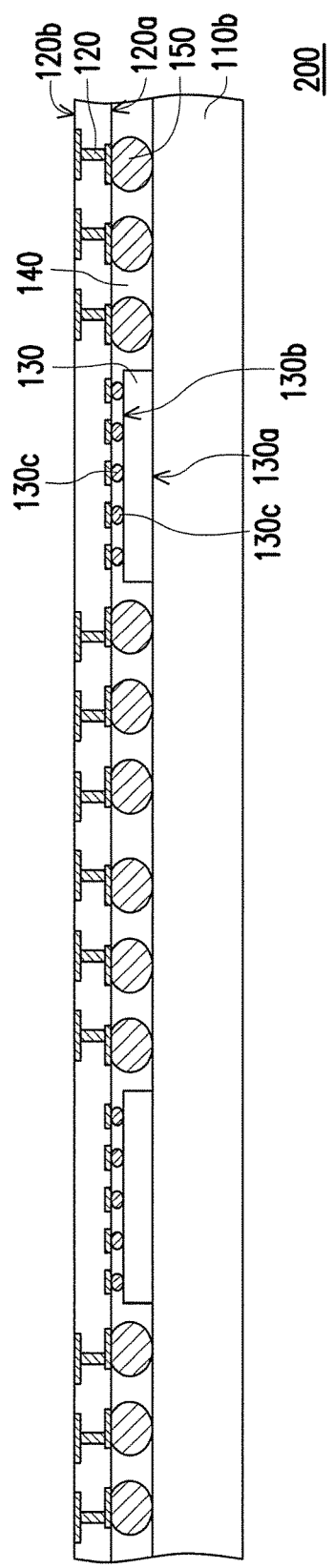
FIG. 2B is a schematic cross-sectional view illustrating along the line A-A of the manufacturing method of the package structure in FIG. 2A.

FIG. 2A is a schematic top view illustrating a manufacturing method of a package structure according to an embodiment of the invention, and FIG. 2B is a schematic cross-sectional view illustrating along the line A-A of the manufacturing method of the package structure in FIG. 2A. Referring to FIG. 2A and FIG. 2B, the structure illustrated in FIG. 1 is flipped upside down and disposed on the carrier 110b to form the package panel 200 after de-bonding the second surface 120b of the redistribution circuit patterns 120 from the carrier 110a. Therefore, the package panel 200 is provided with the second surface 120b facing upward. It should be noted that the first integrated circuit components 130 may be arranged in an array on the carrier 110b.

FIG. 3A is schematic top view illustrating a manufacturing method of a package structure according to an embodiment of the invention. FIG. 3B is a schematic cross-sectional view along the line A-A of the manufacturing method of the package structure in FIG. 3A. Referring to FIG. 3A and FIG. 3B, the package panel 200 sealed with the first encapsulation 140 is cut along the scribe line into strip level to form a plurality of singulated package strips 300. For example, the cutting process in a two-dimensional array, such as a set of row cuts and column cuts may be performed by rotating blade or laser beam, which is not limited thereto. In addition, each of the singulated package strips 300 includes a first singulated encapsulation 240, one of the redistribution circuit patterns 120 and at least one of the first integrated circuit components 130 encapsulated by the first singulated encapsulation 240. The aforementioned processes may be performed in a first process chamber (not illustrated) with large-scale equipment. However, after the cutting process, the singulated package strips 300 may be transferred to a second process chamber (not illustrated) with relatively small-scale equipment in order to perform the following processes. Moreover, the first process chamber and the second process chamber may be isolated or combined, which is not limited thereto.

For instance, the equipment in the first process chamber may perform the package process in a wafer level or a panel level, while the equipment in the second process chamber may perform the package process in a strip level or a block level for efficient assembly. As such, the existing assembly technologies and the existing equipment may be compatible to perform the subsequent package process instead of performing the most package process or even the entire package process with large-scale equipment.

The singulated package strip 300 is attached onto an attachment region 310a of a substrate 310. The substrate 310 is, for example, a glass or other suitable material. It should be noted that the shape, material and thickness of the substrate construe no limitation in the invention as long the substrate 310 is able to withstand the subsequent processes while carrying the package structure formed thereon. In one embodiment, an adhesive layer 330 is at least formed on the attachment region 310a of the substrate 310 to enhance the adhesion between the singulated package strips 300 and the substrate 310. The formation of the adhesive layer 330 on the substrate 310 may be, for instance, performed prior to or after the transferring process of the singulated package strips 300. In one embodiment, the formation of the adhesive layer 330 on the substrate 310 is performed before attaching one of the singulated package strips 300 onto the attachment region 310a of the substrate 310. The adhesive layer 330 may be formed by, for example, attaching a film, applying a paste or glue, or other suitable material and manner, which is not limited thereto.

In the present embodiment, the area of the substrate 310 is greater than the area of the singulated package strip 300. In addition, the substrate 310 includes at least one tooling hole 320 distributed outside of the attachment region 310a. In other words, the tooling holes 320 may be distributed at a periphery area surrounding the attachment region 310a. The tooling hole 320 may be utilized for alignment or affixation of the substrate 310 for the subsequent processes. It should be noted that although three tooling holes 320 are shown in FIG. 3A, the amount of tooling holes 320 is not limited thereto. In one embodiment, the tooling holes 320 may be located on the different planes with the adhesive layer 330. For instance, the tooling holes 320 may be disposed on the sidewalls of the substrate 310. The configuration of the tooling holes is not limited thereto.

For example, the process equipment in the second process chamber may perform the subsequent processes by positioning the tooling holes 320 so as to align the location of the singulated package strips 300 on the substrate 310. Furthermore, for the stability of the subsequent processes, the substrate 310 may be affixed by the tooling holes 320 fixed with a holding fixture (not illustrated). The holding fixture provides a mechanical support for the substrate 310. For instance, the holding fixture may be configured in the second process chamber or to the transferring equipment so as to ensure performing the processes in a stable state. The holding fixture may be positioned at the tooling holes 320 of the substrate 310. For example, the holding fixture may include a plurality of pins which corresponds to the tooling holes 320. When transferring or processing the substrate 310 thereon, the pins of the holding fixture may be inserted into the tooling holes to avoid any undesired movement or shift of the substrate 310. In one embodiment, the holding fixture may be a vacuum fixture or a clamp, but is not limited thereto as long as it may affix the substrate 310 without causing the damage of the singulated package strips 300 during transferring or processing.

FIG. 3C to FIG. 3D are schematic cross-sectional views illustrating a manufacturing method of a package structure according to an embodiment of the invention. Referring to FIG. 3C and FIG. 3D, a plurality of passive components 340 are formed over the second surface 120b of the redistribution circuit patterns 120. In addition, the passive components 340 may be, for instance, disposed corresponding to the conductive terminals 150. It should be noted that the passive components 340 may be disposed in any manner as long as the passive components 340 are electrically connected to the redistribution circuit patterns 120. The passive components 340 may be, for instance, capacitors, resistors, inductors and so on. Moreover, at least one second integrated circuit component 350 is also formed over the second surface 120b of the redistribution circuit patterns 120 by bonding process. For example, the second integrated circuit component 350 may be memory devices such as NAND flash die or other suitable chips, which is not limited thereto. In addition, the second integrated circuit component 350 is electrically connected to the redistribution circuit patterns 120 through wires by wire bonding process. That is to say, the second integrated circuit component 350 is electrically connected to the conductive terminals 150 by wires. In some embodiments, the bonding process of the passive components 340 is performed prior to the bonding process of the second integrated circuit component 350. In some alternative embodiments, the bonding process of the passive components 340 is performed after the bonding process of the second integrated circuit component 350. However, the sequential order of bonding process between the passive components 340 and the second integrated circuit component 350 construe no limitation in the invention.

In the present embodiment, a second encapsulation 360 is formed to encapsulate the passive components 340 and the second integrated circuit component 350. Similar to the first encapsulation 140, the second encapsulation 360 may be also formed by a molding compound or an insulating material by molding process. It may be understood that other components may also be assembled onto the substrate 310, such as when packages in system are being fabricated. Subsequently, a singulation process is performed on the singulated package strips 300 so as to obtain a plurality of package structures 400. Moreover, each of the package structures 400 includes a second singulated encapsulation 360a, the passive components 340 and at least one second integrated circuit component 350. In addition, the second integrated circuit component 350 is electrically connected to the redistribution circuit patterns 120 of the singulated package strip 300. The passive components 340 and the second integrated circuit components 350 are encapsulated by the second singulated encapsulation 360a. Furthermore, the singulation process may be, for example, cutting with rotating blade or laser beam or other suitable technique, which is not limited thereto.

Referring to FIG. 3D, after the singulation process described above, the adhesive layer 330 and the substrate 310 are removed from the package structures 400. For instance, the external energy (for example, UV laser, visible light, or heat) may be applied to the adhesive layer 330, so as to allow the package structures 400 to de-bond from the substrate 310. However, other suitable technique depending on the structure and material of the adhesive layer 330 may be applied, which is not limited thereto. In one embodiment, after removing the adhesive layer 330, an epoxy mold compound (EMC) layer may be further formed over the rear surface 130a in order to encapsulate the first integrated circuit components 130. Moreover, the substrate 310 with the tooling holes 320 may be reused after de-bonding from the package structures 400 so as to reduce the packaging costs.

Based on the foregoing, the package panel is cut to form the singulated package strips before the package process so as to avoid using large-scale equipment to perform such package process. In addition, the package process is more efficient in strip format. Moreover, the package process performed on the substrate with fixed the tooling hole may ensure the stability of the manufacturing process. As such, existing equipment may be leveraged with changes and compatible to the manufacturing process flow and also it maintains a stable manufacturing process as well as improvement of the product yield.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A manufacturing method of a package structure, comprising:
forming a plurality of packaged strips on a carrier in an array, each of the plurality of packaged strips comprises a first encapsulation, a plurality of first integrated circuit components and a plurality of redistribution circuit patterns electrically connected to the first integrated circuit components, the first integrated circuit components are encapsulated by the first encapsulation, and the redistribution circuit patterns are formed on the first encapsulation and the first integrated circuit components, wherein the first encapsulation covers a whole area of the carrier to interconnect the plurality of packaged strips;
cutting along the first encapsulation to separate the plurality of packaged strips from each other;
attaching one singulated package strip of the plurality of packaged strips to a corresponding substrate, the substrate having at least one tooling hole on a periphery of the singulated packaged strip to hold the substrate in place; and
performing a package process over the singulated package strip.

2. The manufacturing method of a package structure according to claim 1, wherein the package process comprises:
forming a plurality of passive components and at least one second integrated circuit component on the singulated package strip, wherein the passive components and the at least one second integrated circuit component are electrically connected to the redistribution circuit pattern of the singulated package strip.

3. The manufacturing method of a package structure according to claim 1, wherein the package process comprises a bonding process, a molding process and a singulation process.

4. The manufacturing method of a package structure according to claim 1 further comprising:
forming an adhesive layer on the substrate before attaching one singulated package strip of the plurality of packaged strips to the substrate; and
after performing the package process, removing the adhesive layer from the singulated package strip.

5. The manufacturing method of a package structure according to claim 1, wherein the area of the substrate is greater than the area of one of the singulated package strips.

6. The manufacturing method of a package structure according to claim 1 further comprising:
after performing the package process, de-bonding the singulated package strip from the substrate.

7. The manufacturing method of a package structure according to claim 1, wherein the package panel further comprises a plurality of conductive terminals electrically connected to the redistribution circuit patterns, and each of the singulated package strips comprises the conductive terminals encapsulated by the first singulated encapsulation.

8. The manufacturing method of a package structure according to claim 2, wherein the package process further comprises:
encapsulating the passive components and the at least one second integrated circuit component by a second encapsulation.

9. The manufacturing method of a package structure according to claim 8, wherein the package process further comprises:
singulating the second encapsulation to form a plurality of package structures, wherein each of the package structure comprises a second singulated encapsulation, a plurality of passive components, and at least one second integrated circuit component electrically connected to the redistribution circuit pattern of the singulated package strip, the passive components and the second integrated circuit components are encapsulated by the second singulated encapsulation.

10. A manufacturing method of a package structure, comprising:
forming a plurality of packaged strips on a carrier in an array in a first process chamber, each of the plurality of packaged strips comprises a first encapsulation, a plurality of first integrated circuit components and a plurality of redistribution circuit patterns electrically connected to the first integrated circuit components, the first integrated circuit components are encapsulated by the first encapsulation, and the redistribution circuit patterns are formed on the first encapsulation and the first integrated circuit components, wherein the first encapsulation covers a whole area of the carrier to interconnect the plurality of packaged strips;
cutting along the first encapsulation to separate the plurality of packaged strips from each other in the first process chamber;
transferring the singulated package strips to a second process chamber, wherein at least one holding fixture is configured in the second process chamber;
attaching one singulated package strip of the plurality of packaged strips to a corresponding substrate-in the second process chamber, the substrate having at least one tooling hole on a periphery of the singulated packaged strip to hold the substrate in place;
affixing the substrate by the at least one holding fixture in the second process chamber, wherein the at least one holding fixture corresponding to the at least one tooling hole of the substrate; and
performing a package process over the singulated package strip in the second process chamber.

11. The manufacturing method of a package structure according to claim 10, wherein the equipment scale in the first process chamber for providing the package panel is greater than the equipment scale in the second process chamber for performing the package process.

12. The manufacturing method of a package structure according to claim 10, wherein the package process comprises:
forming a plurality of passive components and at least one second integrated circuit component on the singulated package strip, wherein the passive components and the at least one second integrated circuit component are electrically connected to the redistribution circuit pattern of the singulated package strip.

13. The manufacturing method of a package structure according to claim 10, wherein the package process comprises a bonding process, a molding process and a singulation process.

14. The manufacturing method of a package structure according to claim 10 further comprising:
forming an adhesive layer on the substrate before attaching one singulated package strip of the plurality of packaged strips to the substrate; and
after performing the package process, de-bonding the singulated package strip from the substrate.

15. The manufacturing method of a package structure according to claim 10, wherein the area of the substrate is greater than the area of one of the singulated package strips.

16. The manufacturing method of a package structure according to claim 10, wherein the package panel further comprises a plurality of conductive terminals electrically connected to the redistribution circuit patterns, and each of the singulated package strips comprises the conductive terminals encapsulated by the first singulated encapsulation.

17. The manufacturing method of a package structure according to claim 12, wherein the package process comprises:
   encapsulating the passive components and the at least one second integrated circuit component by a second encapsulation.

18. The manufacturing method of a package structure according to claim 17, wherein the package process comprises:
   singulating the second encapsulation to form a plurality of package structures, wherein each of the package structure comprises a second singulated encapsulation, a plurality of passive components and at least one second integrated circuit component electrically connected to the redistribution circuit pattern of the singulated package strip, the passive components and the second integrated circuit components are encapsulated by the second singulated encapsulation.

19. The manufacturing method of a package structure according to claim 15 further comprising:
   after performing the package process, removing the adhesive layer from the singulated package strip.

* * * * *